United States Patent [19]
Sato

[11] Patent Number: 5,744,966
[45] Date of Patent: Apr. 28, 1998

[54] INSPECTION APPARATUS FOR SCREENING CONNECTORS WITH ACCESSORIES

[75] Inventor: Takayuki Sato, Shizuoka, Japan

[73] Assignee: Yazaki Corporation, Tokyo, Japan

[21] Appl. No.: 729,069

[22] Filed: Oct. 10, 1996

[30] Foreign Application Priority Data

Oct. 12, 1995 [JP] Japan .................................. 7-264427

[51] Int. Cl.$^6$ .................................................. H01H 31/04
[52] U.S. Cl. .......................... 324/538; 324/754; 324/5.37; 29/593
[58] Field of Search .................................. 324/537, 538; 29/593; 439/310, 487, 488

[56] References Cited

U.S. PATENT DOCUMENTS

| | | | |
|---|---|---|---|
| 4,777,445 | 10/1988 | Kahl | 324/538 |
| 4,902,968 | 2/1990 | Sugimoto | 324/537 |
| 5,335,413 | 8/1994 | Yamamoto | 29/593 |
| 5,467,023 | 11/1995 | Takeyama | 324/754 |
| 5,481,204 | 1/1996 | Aikawa | 324/756 |
| 5,621,328 | 4/1997 | Yamanashi | 324/538 |
| 5,627,473 | 5/1997 | Takani | 324/538 |

FOREIGN PATENT DOCUMENTS

2-56786  12/1990  Japan .

Primary Examiner—Vinh P. Nguyen
Assistant Examiner—Thomas Valone
Attorney, Agent, or Firm—Armstrong, Westerman, Hattori, McLeland & Naughton

[57] ABSTRACT

An inspection apparatus is designed for screening electric connectors, each having a housing, terminal chambers arranged in the connector housing for containing and holding respective metal terminals and accessories including a clip and a terminal holder. The apparatus comprises a connector support and an inspection apparatus main body releasably connectable to the connector support. The inspection apparatus main body is provided with a plurality of test pins urged forward by respective springs for electric connection with an electric test circuit. The connector support is provided with an accessory detection mechanism designed to allow the connector support to approach the inspection apparatus main body in the presence of an accessory to be detected and prevent the connector support from approaching the inspection apparatus main body in the absence of the accessory. Thus, the inspection apparatus for screening connectors can effectively and reliably detect the presence or absence of an accessory in question on each connector and carry out an electric conductivity test at the same time to reject any defective connectors.

2 Claims, 7 Drawing Sheets

INSPECTION APPARATUS FOR SCREENING CONNECTORS WITH ACCESSORIES

BACKGROUND OF THE INVENTION

1. Field of the Invention

This invention relates to an inspection apparatus for screening connectors to be used for connecting wire harnesses of automobiles and, more particularly, it relates to an inspection apparatus for screening electric connectors for the electric conductivity of the connector terminals and the presence of necessary accessories including spacers, clips, rear holders and sealing members fitted to the connectors.

2. Description of the Prior Art

An electric connector to be used in an automobile is typically realized as male or female multi-terminal connector and comprises male or female terminals, whichever appropriate, connected to respective wire terminals and contained in respective terminal chambers of a connector housing, the connector having an anti-release structure for anchoring terminals by so-called terminal-lance or case-lance engagement so that it establishes an electric connection with a matching female or male connector, whichever appropriate, when the two connectors are put in mesh with each other.

Japanese Patent Publication No. 2-56786 discloses an inspection apparatus for screening such multi-terminal connectors, each having a plurality of terminals. The proposed inspection apparatus comprises a connector support and an inspection apparatus main body releasably connectable to said connector support and provided with a test terminal connected to an electric test circuit so that it can examine each terminal of the connector to be inspected for its correct positioning and the electric conductivity to the related wire.

On the other hand, a connector of the type under consideration is typically provided with terminal holders including a spacer and a rear holder that are disposed in position through a window formed at the front end, the rear end or the peripheral wall of the connector housing in order to firmly and securely hold the terminals and also with a clip and a sealing member that are fitted to the housing in order to enhance the handiness and the water-proof of the connector.

However, these accessories such as terminal holders, clips and sealing members are small relative to the connector housing per se and some accessories may be missing from the connectors when they come out of assembly lines.

Figure 9:
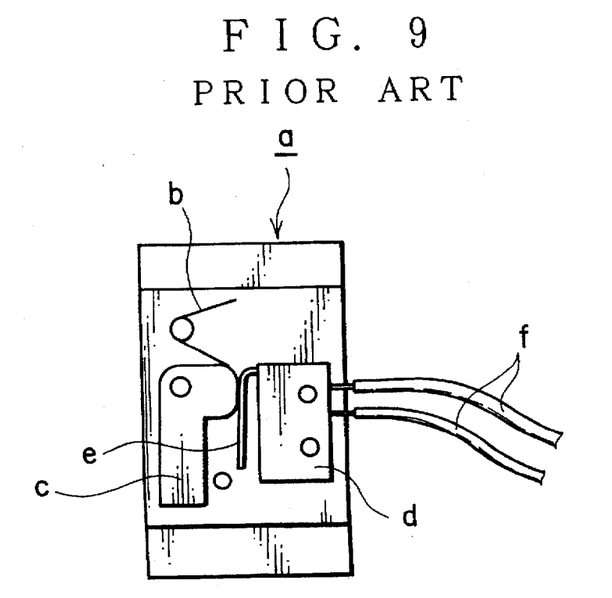
FIG. 9 is a schematic plan view of a known switch block.

This problem may be avoided by providing the connector support or the inspection apparatus main body of the inspection apparatus with a switch block a that is a specifically designed electric circuit as schematically illustrated in FIG. 9 of the accompanying drawings and with which the presence of a specific accessory can be ensured as it pushes a striker c against the resilient force of a spring b and displaces the spring switch e of a microswitch unit d to close an internal contact and energize an electric test circuit f if the accessory is properly fitted to the connector to be inspected.

However, a switch block aa having a configuration as shown in FIG. 9 cannot operate for detecting an accessory with satisfactory reliability because it is subject to possible buckling of the spring, an irregular motion of the striker and possible deterioration in the precision and the durability of the microswitch. Additionally, a microswitch comprises fine and minute components that are produced with complicated and painstaking machining operations and still is liable to a broken wire condition that reduces the microswitch totally inoperative.

SUMMARY OF THE INVENTION

In view of the above problems of known inspection apparatus, an object of the present invention is to provide a novel inspection apparatus for screening connectors with accessories, said apparatus having an improved reliability in detecting the accessories of each connector to be examined and preventing defective or imperfect connectors from passing the inspection.

In order to attain the above object, there is provided an inspection apparatus for screening electric connectors, each having a housing, terminal chambers arranged in said connector housing for containing and holding respective metal terminals and accessories including a clip and a terminal holder and fitted to the housing, said inspection apparatus comprising a connector support and an inspection apparatus main body releasably connectable to said connector support, said inspection apparatus main body being provided with a plurality of test pins urged forward by respective springs for electric connection with an electric test circuit, said connector support being provided with an accessory detection mechanism designed to allow the connector support to approach the inspection apparatus main body in the presence of an accessory to be detected and prevent the connector support from approaching the inspection apparatus main body in the absence of the accessory.

Preferably, said accessory detection mechanism comprises a striker holding chamber arranged under a connector containing chamber of the connector support and separated therefrom by means of a partition, an accessory detection pin retractably projecting through the partition, a striker arranged in the striker holding chamber and having an end pivoted to the striker holding chamber and the other end freely disposed to project into the inspection apparatus main body through the front end of the connector support and a coil spring for urging the striker toward the connector containing chamber, said accessory detection mechanism being constantly supported by said striker at a base portion thereof.

The inspection apparatus main body may have a striker relief hole arranged on the side thereof facing said connector support. In an inspection apparatus according to the invention, the accessory detection mechanism may be arranged on the inspection apparatus main body and not on the connector support.

With an inspection apparatus for screening connectors with an accessories according to the invention and having a configuration as described above, the absence of an accessory in question can be known for certain because the inspection apparatus main body cannot be moved relative to the connector support unless the accessory detection mechanism detects the accessory when the connector to be inspected is placed in position relative to the connector support. When the accessory is placed in position, each metal terminal can be inspected for operation and electric conductivity by means of the corresponding test pin and the electric test circuit arranged in the inspection apparatus main body to check any faulty product.

The accessory detection mechanism of an inspection apparatus according to the invention is structurally simple and can be manufactured relatively easily if it is entirely comprised of mechanical components including an accessory detection pin, a striker designed to pivot in response to the back and forth movement of the accessory detection pin and a coil spring for urging the striker toward the pin. Additionally, such a mechanism is free from the problem of defective contacts, broken wires and other troubles that an electric detection system should face and hence can enhance the reliability of the inspection apparatus.

If the inspection apparatus main body is provided with a relief hole arranged vis-a-vis the opposite connector support, the inspection apparatus main body can fully approach the connector support only when the accessory in question is placed in position so that a defective connector devoid of the accessory will be rejected before it is tested for electric conductivity.

Finally, an inspection apparatus for screening connectors according to the invention can effectively detect an accessory in question regardless of the location it is fitted to the connector, be it arranged on the front end, on the rear end or on the peripheral wall, if the accessory detection mechanism is arranged on the inspection apparatus main body in stead of the connector support.

The above and other objects and features of the present invention will be more apparent from the following description taken in conjunction with the accompanying drawings.

DETAILED DESCRIPTION OF THE PREFERRED EMBODIMENTS

Now, the present invention will be described in greater detail by referring to the accompanying drawings that illustrate preferred embodiments of the invention.

Referring firstly to FIGS. 1 through 6 that illustrate a first embodiment of the invention, A denotes the embodiment of inspection apparatus and B denotes an connector to be inspected by the inspection apparatus A, which apparatus A comprises a frame 1, a connector support 3 arranged at an end of the frame 1, an inspection apparatus main body 4 arranged vis-a-vis the connector support 3, a lever 12 and a accessory detection mechanism 21.

Figure 1:
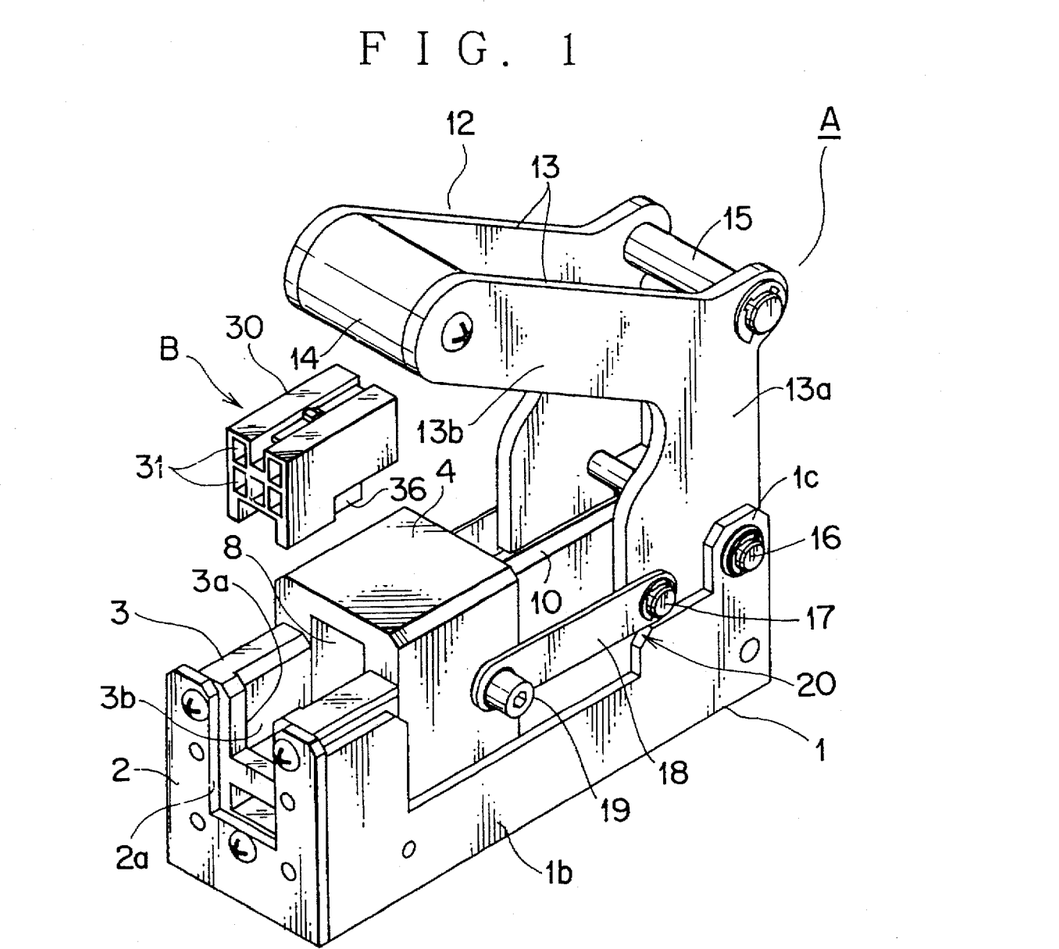
FIG. 1 is a schematic perspective view of an embodiment of inspection apparatus according to the invention.
Figure 2:
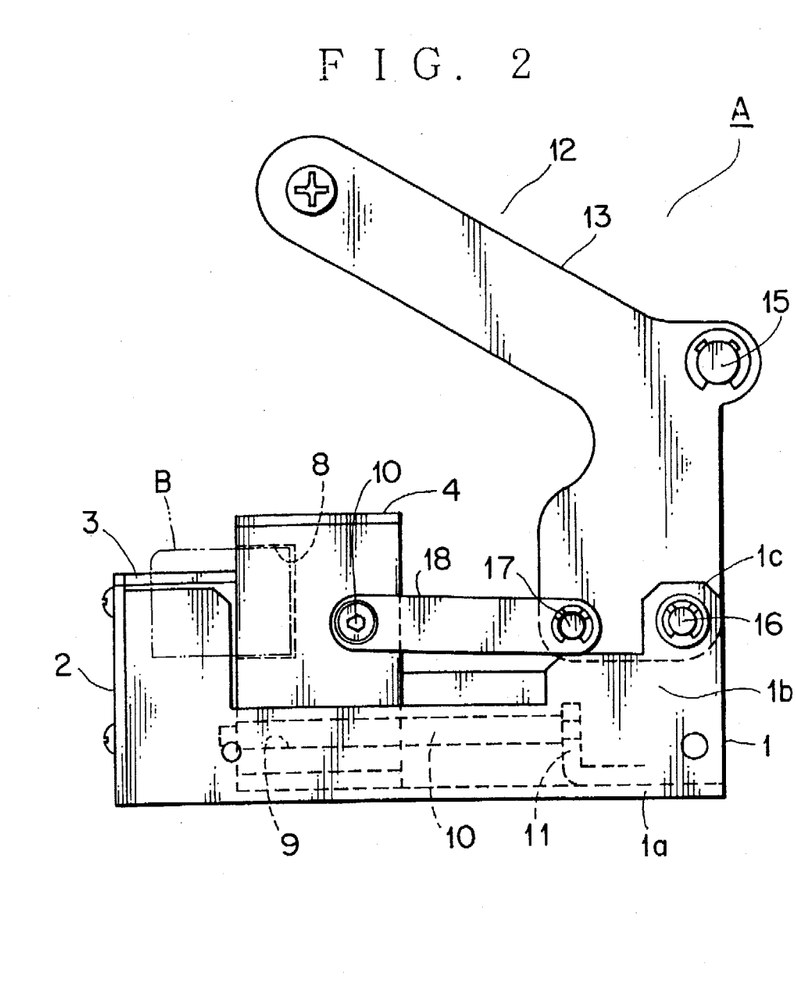
FIG. 2 is a side view of the inspection apparatus of FIG. 1.

The frame 1 is trough-shaped and has a fixed wall 2 arranged on a side thereof and provided with a wire lead-out port 2a and the connector support 3 is rigidly secured to the fixed wall 2.

The inspection apparatus connector 4 is arranged on the other side of the frame 1 in such a way that it can be moved toward and away from the connector support 3 by operating the lever 12.

The connector support 3 is box-shaped and open at the top and at the side facing the inspection apparatus main body 4 and a connector chamber 3a is defined in it. The connector support 3 is additionally provided with a wire lead-out port 3b at the side facing the fixed wall 2 and the connector B can be put into the connector support 3 from above as wire W1 extending from the rear end of the connector B is guided through the wire lead-out ports 3b and 2a (see FIG. 6).

Figure 6:
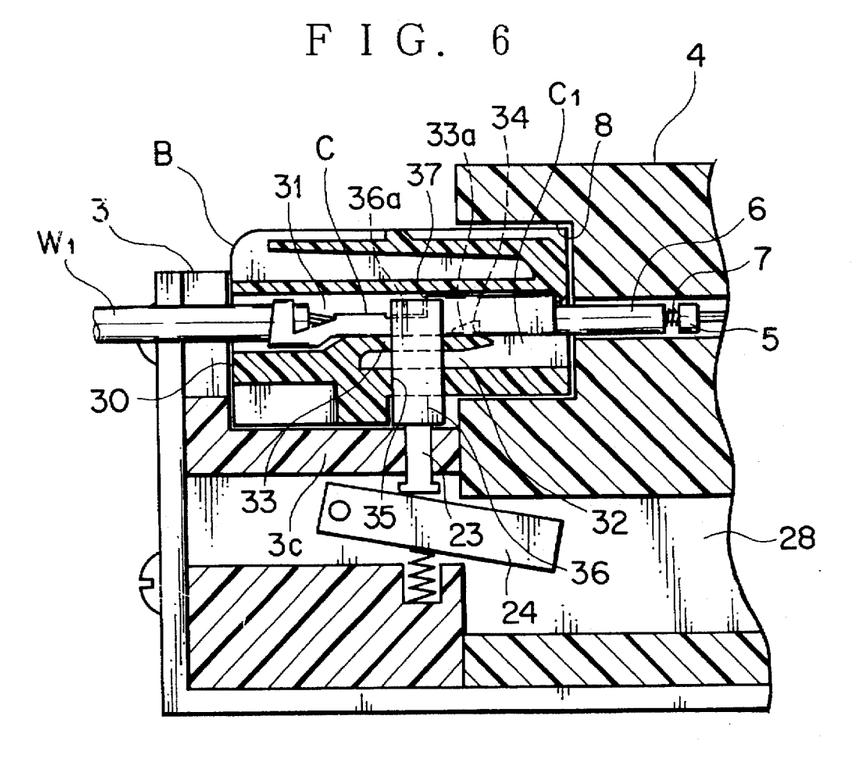
FIG. 6 is a partial sectional view of the embodiment of FIG. 1, showing a principal area of the apparatus in the course of checking the accessory in question and the electric conductivity of a metal terminal.

As seen from FIG. 6, a plurality of test terminals 5 are arranged in the inspection apparatus main body 4 so as to provide a one-to-one correspondence to the plurality of terminal chambers 31 arranged in the housing 30 of the connector B and each test pin 6 is slidably fitted to a corresponding test terminal 5 and urged into inspection chamber 8 arranged in front thereof by means of a coil spring 7. The test terminals 5 are connected to an electric test circuit (not shown) provided with a check lamp and having a configuration known to those skilled in the art.

The inspection apparatus main body 4 is slidable toward and away from the-connector support 3. More specifically, the inspection apparatus main body 4 is provided with a pair of guide holes 9 running longitudinally through the lower lateral portions thereof, through which a pair of guide rods 10 are arranged respectively. An end of each of said guide rods 10 is secured to the connector support 3 while the other end is secured to a rod stopper 11 arranged on the bottom wall of the frame 1.

The lever 12 is comprised of a pair of lever plates 13, 13, each having a wide base section 13a and a handling plate section 13b extending obliquely and upwardly from the base section 13a.

The lever plates 13 are connected with each other by way of a spacer 14 and a joint rod 15 arranged respectively at the upper end and at an intermediary area thereof, or the opposite ends of the handling plates 13b, 13b.

On the other hand, the base sections 13a are jointly rotatable around a pin 16 running through respective rear bottom areas thereof and supported by flanges 1c of the lateral walls 1b of the frame 1. Links 18 are pivotally connected at the rear end thereof to a front bottom area of the respective base sections 13a by means of pins 17 and at the front end thereof to the respective lateral walls of the inspection apparatus main body 4.

The assembled lever 12, links 18 and inspection apparatus main body 4 are provided on each side with a toggle mechanism 20 that arrests the corresponding pin 17 when the latter is lowered slightly from the horizontal line connecting the pins 16 and 17 and a stud bush 19 holding the front end of the link 18 to the inspection apparatus main body 4 so that a front half of a connector B can be securely put into the inspection chamber 8 until it gets into contact with the test pin 6 and held to that position.

Figure 3A:
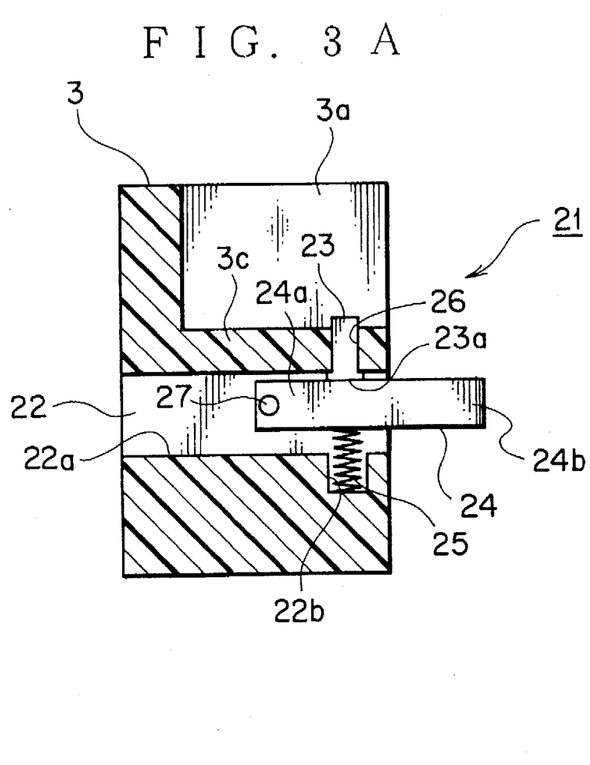
FIGS. 3A and 3B are enlarged partial sectional views of the accessory detection mechanism of the embodiment of FIG. 1 in two different steps of operation.
Figure 3B:
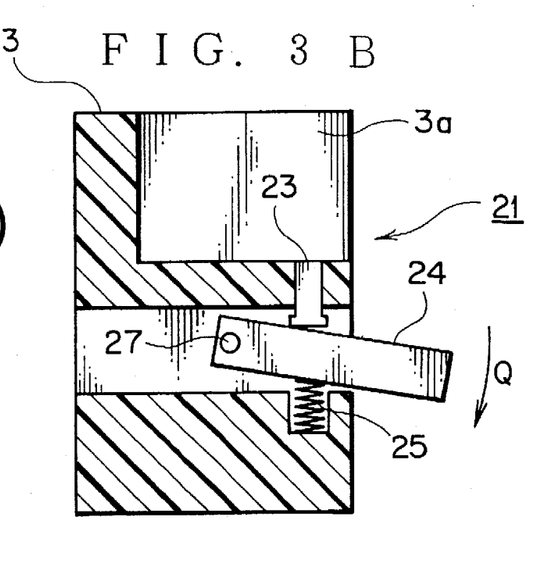

As shown in FIG. 3, the accessory detection mechanism 21 comprises a striker holding chamber 22, an accessory detection pin 23 arranged in said chamber 22, a striker 24 and a coil spring 25 and the inspection apparatus main body 4 is provided at a front lower portion thereof with a striker relief hole 28 disposed vis-a-vis the striker 24.

More specifically, the striker holding chamber 22 is open at the front and rear ends thereof and disposed under the connector chamber 3a of the connector support 3 with a partition 3c arranged therebetween and operating as a seat for receiving the connector housing 30. The partition 3c is provided with a through hole 26 and the accessory detection pin 23 is retractably projecting through the through hole 26. The accessory detection pin 23 is provided at the lower end thereof with a flange 23a that operates as a stopper and supported on the upper surface of the striker 24. The striker 24 is pivotally supported at a base section 24a thereof with a pin 27 in such a manner that the front end 24b of the striker 24 is projecting from the front surface of the connector support 3 toward the inspection apparatus main body 4. Additionally, the striker 24 is urged toward the connector chamber 3a by means of a coil spring 25 arranged between the rear surface of the striker 24 and the bottom wall 22a of the striker holding chamber 22 so that the striker 24 is normally held to a horizontal position and the front end of the accessory detection pin 23 is projecting into the connector chamber 3a. Reference symbol 22b denotes a spring receiving hole arranged in the bottom wall of the striker holding chamber 22.

As seen from FIGS. 1 and 6, a plurality of terminal chambers 31 (ten or upper five and lower five terminal chambers in this embodiment) are formed in the housing 30 of the connector B.

Each of the terminal chambers 31 has a flexible deformation/displacement accommodating space 32 therein and contains a flexible holder 33 having a holder hook 33a such that, as a metal terminal C is fully inserted into the chamber to a proper position, the holder hook 33a moves into and becomes engaged with an engaging hole 34 formed in the electric contact C1 of the metal terminal C in order to prevent the metal terminal C from slipping back from the terminal chamber 31. The peripheral wall of the housing 30 is provided with a window 35 and a terminal holder 36 arranged in position through the window 35 also becomes engaged with a shoulder section 37 of the electric contact C1 of the metal terminal C at a tip 36a thereof in order to doubly prevent the metal terminal C from slipping back from terminal chamber 31.

The inspection apparatus A operates in the following manner for inspecting a connector B.

Figure 4:
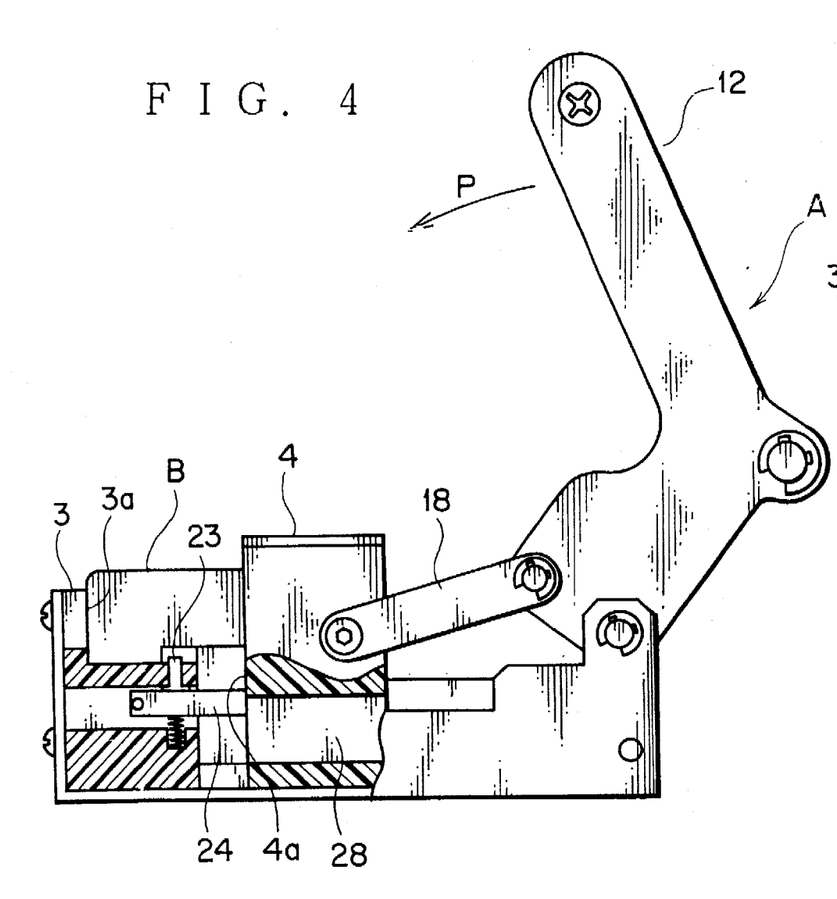
FIG. 4 is a partially cut away side view of the embodiment of FIG. 1, showing a step of operation.

Referring to FIGS. 4 and 6, when a connector B is placed in position in the connector chamber 3a of the connector support 3, the front end of the accessory detection pin 23 can still move into the terminal chamber 31 through the window 35 of the housing 30 if an terminal holder 36 is not arranged in position yet so that the accessory detection pin 23 and the striker 24 are not displaced. In other words, the striker 24 is still held to its horizontal position.

If the lever 12 is pulled in the direction of arrow P in FIG. 3 under this condition, the inspection apparatus main body 4 is moved slightly forward toward the connector support 3 but its advancement is blocked when the front end of the horizontally disposed striker 24 abuts the front surface 4a of the inspection apparatus main body 4. Thus, the inspection apparatus A detects that the connector B is not provided with a terminal holder 36, an accessory, before it tests the metal terminal C for electric conductivity.

Figure 5:
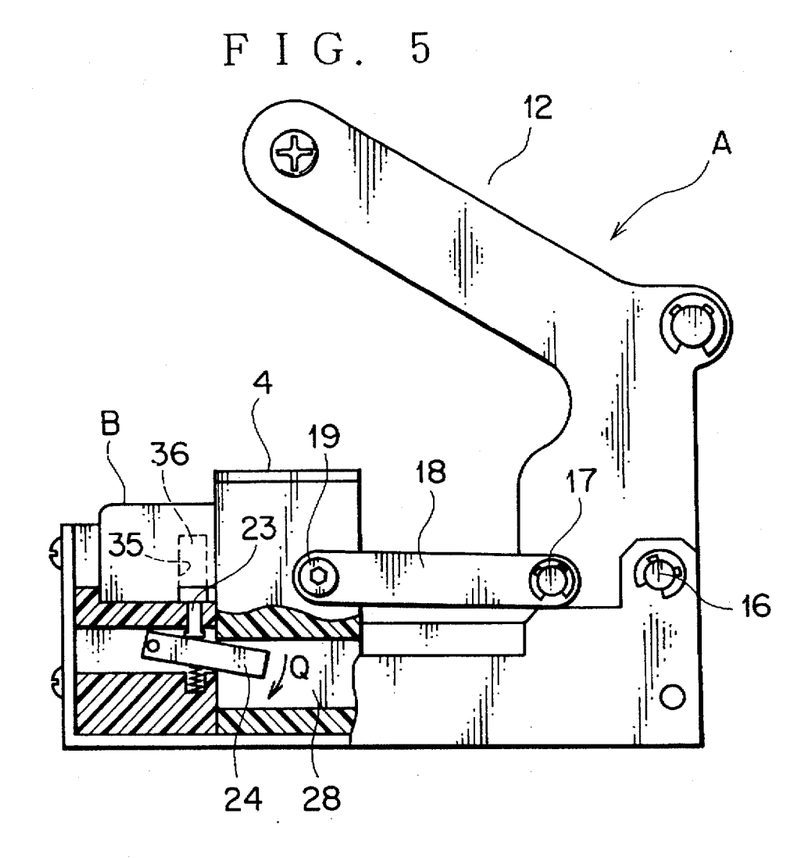
FIG. 5 is a partially cut away side view similar to FIG. 4 but showing a subsequent step of operation.

When, on the other hand, a connector B is placed in position in the connector chamber 3a of the connector support 3 and already equipped with a terminal holder 36, the terminal holder 36 depresses the accessory detection pin 23 as shown in FIGS. 3B, 5 and 6. Then, the striker 24 is also rotated in the direction of arrow Q to become inclined. Thus, the front end of the striker 24 can move into the striker relief hole 28 without abutting the front surface 4a of the inspection apparatus main body 4 so that, as the lever 12 is operated, the main body 4 moves on toward the connector support 3 until the pins 16 and 17 and the stud bush 19 are substantially aligned due to the toggle mechanism 20 on each side, when the inspection apparatus main body 4 is stopped.

When the connector B is tested for electric conductivity under this condition, said electric test circuit will be electrically connected to the connector B because the test pin 6 corresponding to the metal terminal C is moved backward to contact the test terminal 5 against the resilient force of the coil spring if the connector B operates properly. As a result, the connector B is checked for the provision of said accessory, the proper arrangement of the metal terminal C and its electric continuity to the connection wire W1.

If the metal terminal C is defective or not arranged properly in the connector B, it can be rejected according to any known ordinary procedure, which will not be described here.

After the end of the inspection, the lever 12 is moved oppositely to separate the inspection apparatus main body 4 from the connector support 3.

The accessory detection mechanism 21 is comprised of simple mechanical components including an accessory detection pin 23, a striker 24 that pivots as the pin is moved back and forth and a coil spring 25 for biasing the pin and hence can be manufactured easily at low cost. Additionally, it is free from electricity related problems including defective contacts and broken wires unlike the case where an electric device is used and hence very reliable.

Figure 7A:
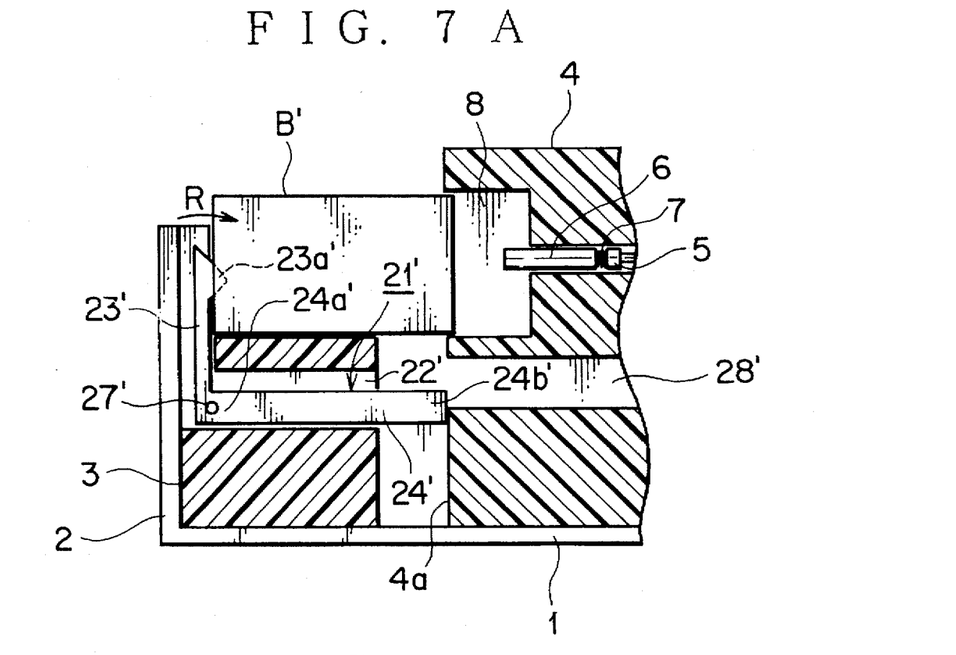
FIGS. 7A and 7B are enlarged partial sectional views of the accessory detection mechanism of another embodiment in two different steps of operation.
Figure 7B:
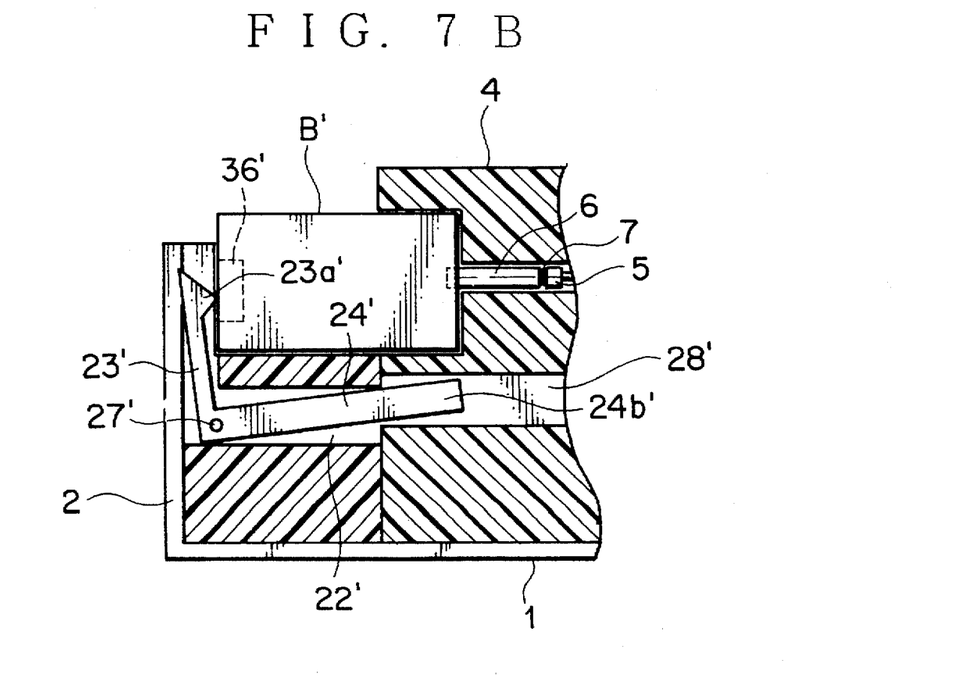

FIGS. 7A and 7B are enlarged partial sectional views of the accessory detection mechanism of another embodiment in two different steps of operation.

Connector B' comprises a rear holder 36' fitted to the rear end of the housing as terminal holder and the accessory detection mechanism 21' is designed to check for the presence or absence of the rear holder 36'. A striker holding chamber 22' is arranged under the connector support 3 and a striker 24' is pivotally supported at a base section 24a' thereof with a pin 27' as in the case of the first embodiment. However, the base section 24a' of this striker 24' is pivotally fitted to the rear end of the striker holding chamber 22' and an accessory detection pin 23' is integrally formed with the striker 24' as an L-shaped member.

Additionally, the accessory detection pin 23' is provided near its free end with a detection boss 23a' projecting pyramidally toward the connector chamber 3a. A coil spring (not shown) is wound around the pin 27' pivotally supporting the striker 24' to urge the accessory detection pin 23' in the direction of arrow R in FIG. 7A.

The second embodiment having a configuration as described above operates as follows. When a connector B' is placed in position in the connector chamber 3a of the connector support 3, the pyramidal detection boss 23a' of the accessory detection pin 23 abuts the rear surface of the connector B' and driven to rotate in the direction opposite to that of arrow R. If a rear holder 36' is not arranged in position, the detection boss 23a' is partly moved into connector B' under the effect of the coil spring to maintain the striker 24' to the horizontal position as shown in FIG. 7A so that the front end 24b' of the striker 24' eventually abuts the front surface 4a of the inspection apparatus main body 4 to block any further advancement of the inspection apparatus main body 4. Thus, inspection apparatus A detects the absence of a rear holder 36'.

When, on the other hand, a connector B is placed in position in the connector chamber 3a. of the connector support 3 and already equipped with a rear holder 36', the accessory detection pin 23' is tilted backward to allow the front end 24b' of the striker 24' enter the striker relief hole 28' of the inspection apparatus main body 4 as shown in FIG. 7B so that the inspection apparatus main body 4 moved toward the connector support 3 as the lever 12 is operated.

Figure 8A:
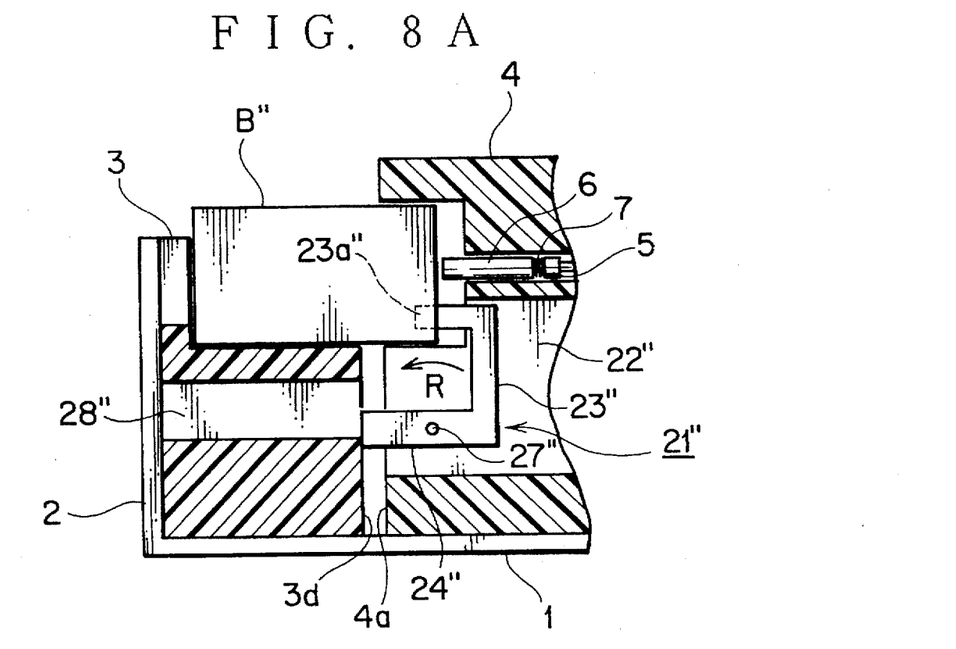
FIGS. 8A and 8B are enlarged partial sectional views of the accessory detection mechanism of still another embodiment in two different steps of operation.
Figure 8B:
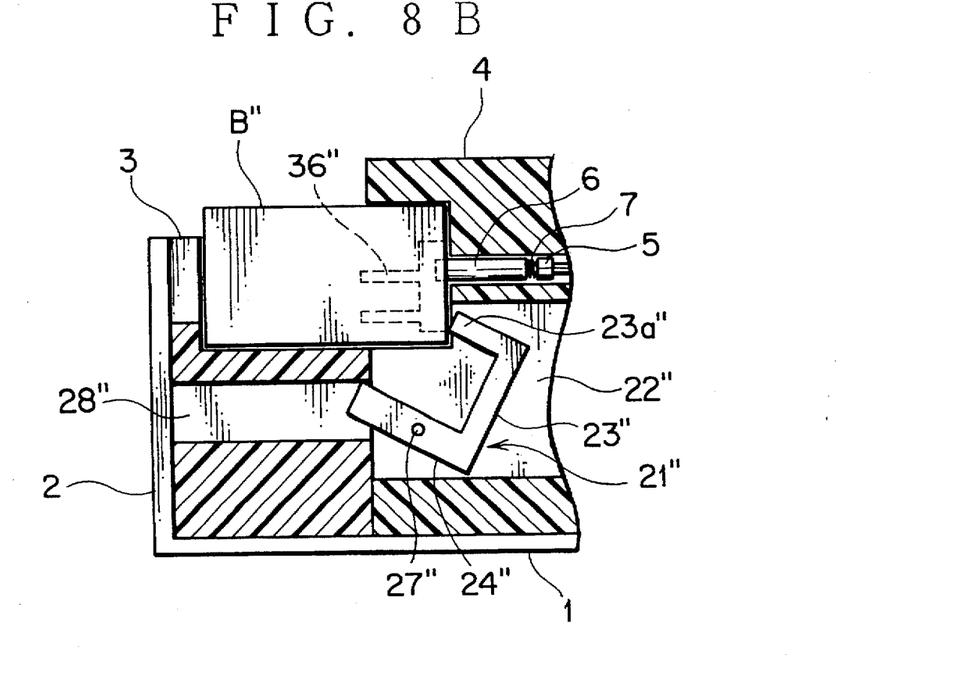

FIGS. 8A and 8B are enlarged partial sectional views of the accessory detection mechanism of still another embodiment in two different steps of operation.

Connector B" comprises a front holder 36" fitted to the front end of the housing as terminal holder and the accessory detection mechanism 21" is provided with a striker 24" and an accessory detection pin 23" at positions adapted to detect the front holder 36". The connector support 3 is provided with a striker relief hole 28" at a corresponding position.

The striker 24" is pivotally supported at a central section thereof with a pin 27" in the striker holding chamber 22" and an L-shaped accessory detection pin 23" is integrally formed with the striker 24" and extending rectangularly from the base end of the striker 24" so that the striker 24" and the accessory detection pin 23" are U-shaped as a whole. A coil spring (not shown) is wound around the pin 27" to urge the accessory detection pin 23" in the direction of arrow R in FIG. 8A. Thus, normally, the striker 24" and the front end section 23a" of the accessory detection pin 23" are held horizontal and a front end portion of the striker 24" is projecting from the front surface 4a of the inspection apparatus main body 4 toward the connector support 3, while the front end section 23a" of the accessory detection pin 23" is located in the inspection chamber 8.

In FIG. 8A, the connector B" is not equipped with a front holder 35" and, therefore, the front end section 23a" of the accessory detection pin 23" is allowed to enter the connector B" until the front end of the striker 24" abuts the front surface 3d of the connector support 3 to block any further advancement of the connector B" into the inspection chamber 8 of the inspection apparatus main body 4. In other words, although the inspection apparatus main body 4 is moved forward to a position close to the connector support 3 as the lever 12 is operated, it is stopped before the test pin 6 gets into contact with the metal terminal C in the connector B".

In FIG. 8B, on the other hand, the connector B" is equipped with a front holder 36" and, therefore, the front end section 23a" of the accessory detection pin 23" is pushed to pivot the striker 24" around the pin 27" until a front end portion of the striker 24" enters the striker relief hole 28" and the connector B" is completely moved into the inspection chamber 8.

As described above, the accessory detection mechanisms 21 through 21" respectively detect the terminal holder 36, 36' and 36" arranged respectively at the front, rear and middle of the connectors to be examined. Therefore, it will be understood that the above description essentially applies to any other accessories such as clips and sealing members fitted to the housing.

What is claimed is:

1. An inspection apparatus for screening electric connectors, each having a housing, terminal chambers arranged in said connector housing for containing and holding respective metal terminals and accessories including a clip and a terminal holder and fitted to the housing, said inspection apparatus comprising:

a connector support; and an inspection apparatus main body releasably connectable to said connector support, wherein said inspection apparatus main body is provided with a test pin urged forward by a spring for electric connection with an electric test circuit, and wherein said inspection apparatus main body has a striker relief hole arranged on a side facing a side thereof facing said connector support;

said connector support being provided with an accessory detection mechanism designed to allow said connector support to approach said inspection apparatus main body when an accessory to be detected is present and to prevent said connector support from approaching said inspection apparatus main body when said accessory to be detected is not present, wherein said accessory detection mechanism comprises a striker holding chamber arranged under a connector containing chamber of said connector support and separated therefrom by means of a partition, an accessory detection pin retractable protecting through said partition, a striker arranged in the striker holding chamber and having a first end pivoted towards said striker holding chamber and a second opposed end freely disposed to project into said inspection apparatus main body through a front end of said connector support and a coil spring for urging said striker toward said connector containing chamber, said accessory detection mechanism being constantly supported by said striker at a base portion thereof.

2. An inspection apparatus for screening electric connectors, each electric connector having a connector housing, each electric connector terminal chambers arranged in said connector housing for containing and holding respective metal terminals and accessories including a clip and a terminal holder and each electric connector fitted to said connector housing, said inspection apparatus comprising:

a connector support: and an inspection apparatus main body releasably connectable to said connector support, wherein said inspection apparatus main body is provided with a test pin urged forward by a spring for electric connection with an electric test circuit, and said inspection apparatus main body is provided with an accessory detection mechanism designed to allow said connector support to approach said inspection apparatus main body when an accessory to be detected is present and to prevent said connector support from approaching said inspection apparatus main body when said accessory to be detected is not present, wherein said accessory detection mechanism comprises a striker holding chamber arranged under a connector containing chamber of said connector support and separated therefrom by means of a partition, an accessory detection pin retractably projecting through said partition, a striker arranged in the striker holding chamber and having a first end pivoted towards said striker holding chamber and a second opposed end freely disposed to project into said inspection apparatus main body through a front end of said connector support and a coil spring for urging said striker toward said connector containing chamber, said accessory detection mechanism being constantly supported by said striker at a base portion thereof, and wherein said inspection apparatus main body has a striker relief hole arranged on a side facing a side thereof facing said connector support.

* * * * *